(12) United States Patent
Suzuki

(10) Patent No.: US 6,552,846 B1
(45) Date of Patent: Apr. 22, 2003

(54) CATOPTRIC OPTICAL ELEMENT, ILLUMINATION OPTICAL SYSTEM EQUIPPED THEREWITH, PROJECTION EXPOSURE APPARATUS AND METHOD FOR MANUFACTURING SEMICONDUCTOR DEVICE

(75) Inventor: Kenji Suzuki, Koshigaya-si (JP)

(73) Assignee: Nikon Corporation, Tokyo (JP)

( * ) Notice: Subject to any disclaimer, the term of this patent is extended or adjusted under 35 U.S.C. 154(b) by 54 days.

(21) Appl. No.: 09/685,142

(22) Filed: Oct. 11, 2000

(30) Foreign Application Priority Data

Oct. 12, 1999 (JP) .......................................... 11-290019

(51) Int. Cl.[7] ................................................ F21V 9/06
(52) U.S. Cl. ........................ 359/359; 359/350; 359/360
(58) Field of Search ................................ 359/350, 351, 359/359, 360, 364–366, 727–732; 385/133; 362/32; 355/67, 73

(56) References Cited

U.S. PATENT DOCUMENTS 4,477,087 A * 10/1984 Sutter, Jr. et al. ............. 277/26
4,562,583 A * 12/1985 Hoover et al. ................ 378/43

FOREIGN PATENT DOCUMENTS

JP          A-11-54426          2/1999

OTHER PUBLICATIONS

English-language translation of JP-A-11-54426.

* cited by examiner

*Primary Examiner*—Thong Nguyen
(74) *Attorney, Agent, or Firm*—Oliff & Berridge PLC

(57) ABSTRACT

A catoptric element is made from a hollow member having inner reflective surfaces that can reflect light having a wavelength shorter than 157 nm. An illumination optical system for illuminating an illumination plane includes a light source for providing a light flux, the catoptric element, which generates a plurality of images of the light source by internally reflecting the light flux from the light source, and a relay optical system for leading the light from the catoptric element to the illumination plane. A projection exposure apparatus for projecting and transferring a predetermined pattern formed on a projection original onto a substrate to be exposed via a projection optical system includes the illumination optical system, which forms the illumination plane on the projection original. The projection exposure apparatus can be used to manufacture various devices.

25 Claims, 9 Drawing Sheets

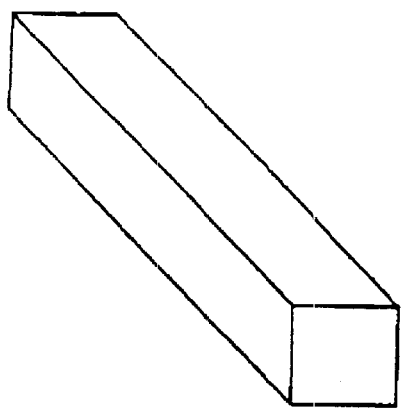
FIG.3(b)
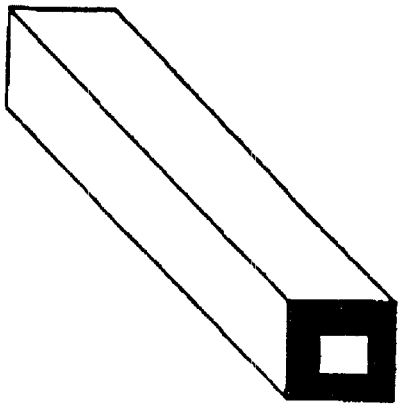
FIG.3(e)
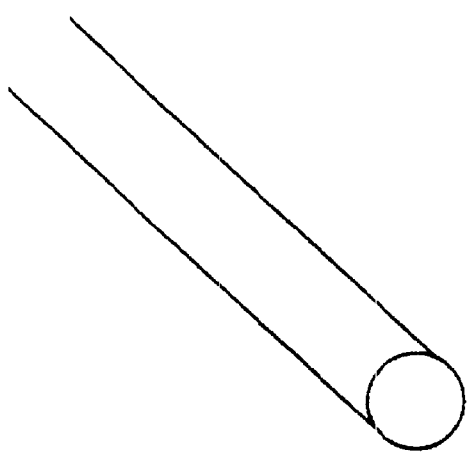
FIG.3(a)
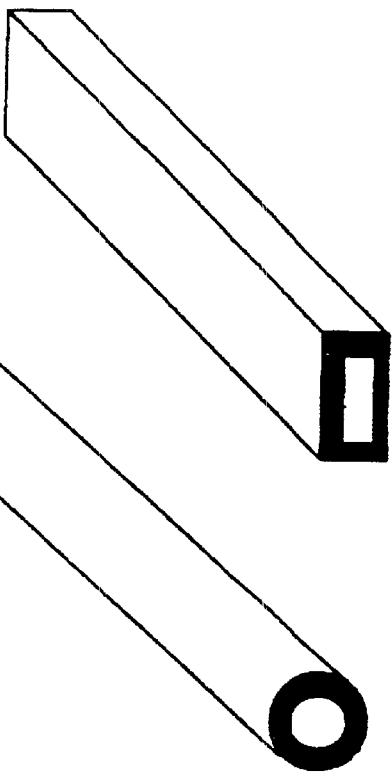
FIG.3(d)
FIG.3(c)

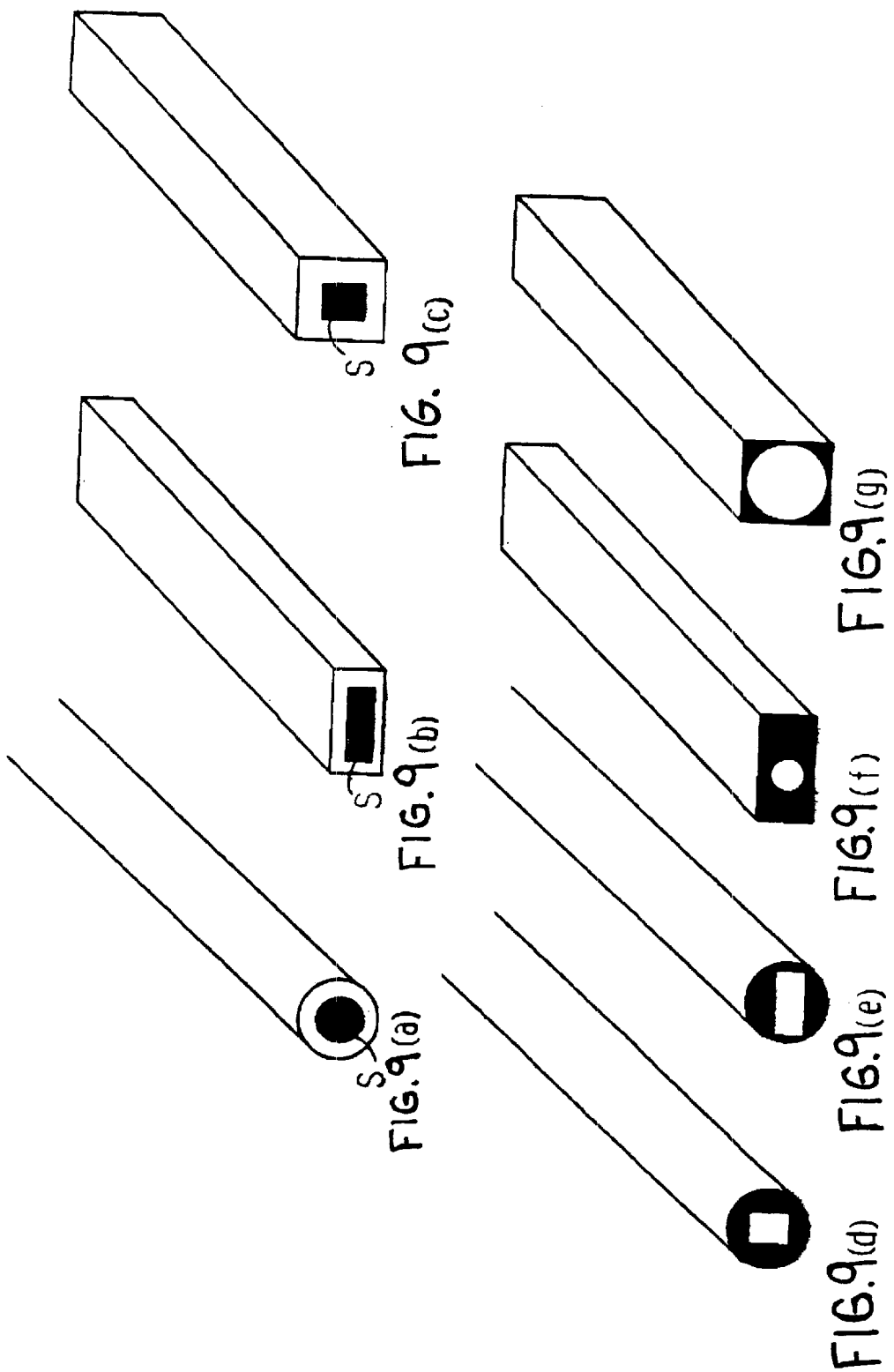

CATOPTRIC OPTICAL ELEMENT, ILLUMINATION OPTICAL SYSTEM EQUIPPED THEREWITH, PROJECTION EXPOSURE APPARATUS AND METHOD FOR MANUFACTURING SEMICONDUCTOR DEVICE

BACKGROUND OF THE INVENTION

1. Field of the Invention

The invention relates to a catoptric optical element for generating uniform illuminance distribution by converging light emanated from a light source and, in particular, relates to a catoptric optical element suitable for use in a projection exposure apparatus for manufacturing, for example, a semiconductor integrated circuit having a fine pattern.

2. Description of Related Art

With the improvement of the density and the degree of integration of semiconductor devices such as LSI, IC, and the like, a resolving power required of a projection exposure apparatus that manufactures semiconductor devices such as LSI or IC has been increasing year after year. The resolving power of a projection exposure apparatus is proportional to a numerical aperture on a wafer side of a projection optical system of the projection exposure apparatus and is inversely proportional to a wavelength of the exposure light. Thus, in the field of semiconductor manufacturing, efforts are being made to employ an exposure light having shorter wavelength in order to fabricate ultra-fine IC circuits. The wavelength of the exposure light that is being used is shifting from i-line having a wavelength of 365 nm of a mercury lamp to KrF excimer laser light source having a wavelength of 248 nm. Moreover, ArF excimer laser sources having a wavelength of 193 nm have come to the stage of practical application and, furthermore, efforts are being made to use F2 excimer laser sources having a wavelength of 157 nm.

However, when the wavelength of the exposure light becomes short, the transmittance of material that can be used as a dioptric element is greatly reduced. Thus, it is difficult to design an optical system using a dioptric element for use with light sources in the short wavelength region.

Therefore, a catoptric system that does not include a dioptric system has been proposed for use in manufacturing LSI, IC, or the like, with a projection exposure apparatus. Various types of catoptric systems have been proposed for use as a projection optical system in a projection exposure apparatus for projecting and transferring a circuit pattern formed on a reticle (mask) onto a wafer (substrate).

However, in a projection exposure apparatus using a wavelength shorter than 157 nm, when an illumination optical system for illuminating a reticle plane with uniform illuminance is intended to be constructed, it has been impossible to obtain a uniform illumination light because a fly-eye lens, a rod type optical integrator, or the like, which is a conventional optical system used for reducing non-uniformity in illumination, cannot be used.

SUMMARY OF THE INVENTION

The invention is made in view of the aforementioned problem and has as one object to provide a catoptric element capable of producing a uniform illuminance distribution having a wavelength shorter than 157 nm. It also is an object to employ such a catoptric element in an illumination optical system, a projection exposure apparatus, and in a method for manufacturing devices such as, for example, LSI, IC, or other micro-devices (e.g., an imaging element (e.g., a CCD), a thin film magnetic head, and a liquid crystal display element).

In order to address the aforementioned problem, one aspect of the invention provides an optical element made from a hollow member having inner surfaces that can reflect light having a wavelength shorter than 157 nm.

Preferably, the inner reflective surface is coated with a single- or multiple-layer film of coating materials to enhance reflectance. It is preferable that the materials are Mo (molybdenum)/Si (silicon), W (tungsten)/Si, Cr (chromium)/C (carbon), Ni (nickel)/C, NiCr (nickel.chromium)/C, or the like. Accordingly, even an EUV light (an extreme ultraviolet light having a wavelength shorter than 100 nm) can be effectively used with high reflectance.

Another aspect of the invention provides an illumination optical system for illuminating a plane to be illuminated (an illumination plane). The illumination optical system includes a light source for providing a light flux, the aforementioned catoptric element for generating a plurality of images of the light source by internally reflecting the light flux supplied from the light source, and a relay optical system for leading the light from the catoptric element to the illumination plane.

Another aspect of the invention provides a projection exposure apparatus for projecting and transferring a pattern formed on a projection original (e.g., a mask) onto a substrate to be exposed. The projection exposure apparatus includes the aforementioned illumination optical system which forms the aforementioned illumination plane to be illuminated onto the aforementioned projection original.

Another aspect of the invention provides a method for manufacturing a device including the steps of: applying a photosensitive material onto a substrate to be exposed, projecting the pattern formed on the projection original onto the substrate via the projection optical system, developing the photosensitive material on the substrate, and forming a predetermined circuit pattern on the substrate by using the photosensitive material after being developed as a mask.

Furthermore, in the invention, it is preferable that the wavelength of the light to be used is shorter than 50 nm.

BRIEF DESCRIPTION OF THE DRAWINGS

The invention will be described in conjunction with the following drawings in which like reference numerals designate like elements and wherein:

FIGS. 3(a) through (e) are diagrams showing variations of the first embodiment;

FIGS. 9(a) through (g) are diagrams showing other variations of the first embodiment.

DETAILED DESCRIPTION OF PREFERRED EMBODIMENTS

Embodiments of the invention are explained with reference to the attached drawings.

First Embodiment

Figure 1:
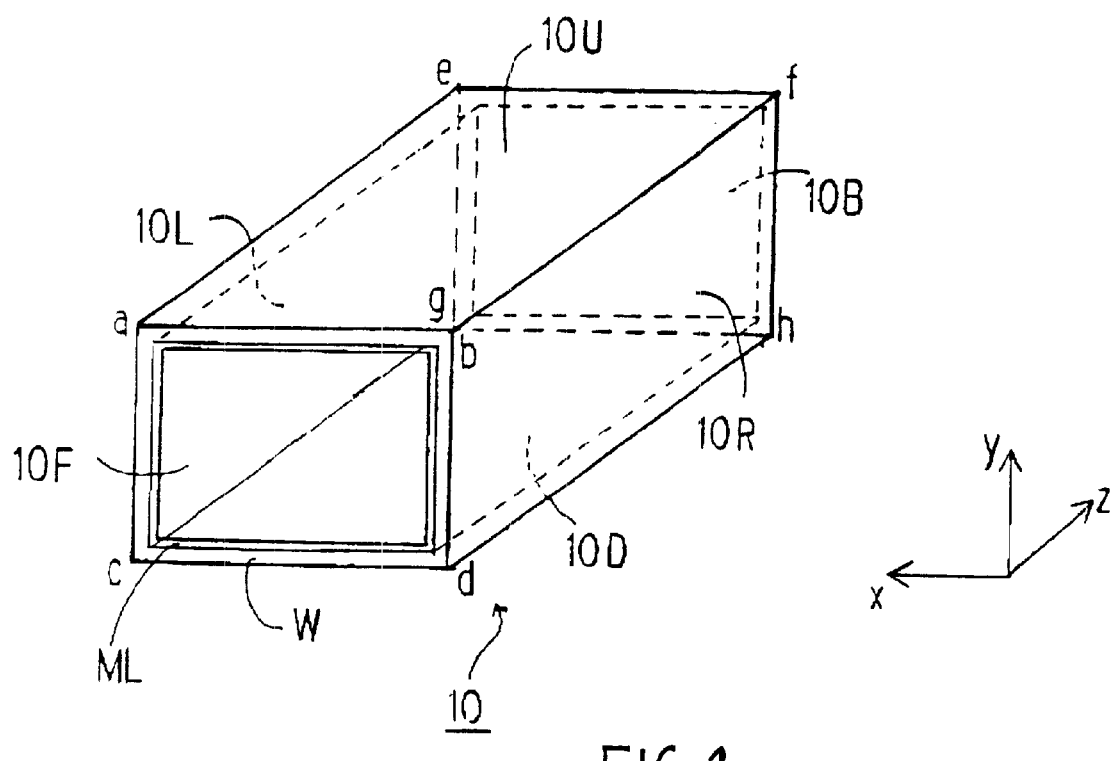
FIG. 1 is a perspective view of a catoptric element according to a first embodiment of the invention.

FIG. 1 is a perspective view of a catoptric element 10 according to a first embodiment of the invention. The element 10 has a shape of a hollow four-sided prism whose sectional shape is a rectangle a-b-c-d. Catoptric element 10 has four inner surfaces (hereinafter, when the four inner surfaces are referenced generically, they will be called "inner surface W"), i.e., an upper inner surface 10U, a lower inner surface 10D, a right inner surface 10R, and a left inner surface 10L. Catoptric element 10 also includes incident surface 10F and exit surface 10B. The shape of the exit surface 10B is a rectangle e-f-g-h. The inner surface W is coated with a multi-layer film ML having a constant thickness and high reflectance to light with a wavelength shorter than 157 nm. It is preferable that the materials of the multi-layer film are the aforementioned Mo/Si, W/Si, or the like when the light to be used is an EUV light. Moreover, because light having a wavelength shorter than 157 nm (particularly, 30 nm, 13 nm, 11 nm) is greatly absorbed by air and thus has poor usability in air, it is preferable that the catoptric element 10 be evacuated at least inside of the hollow part or filled with gas having low absorption or high transparence to the light to be used. Furthermore, the catoptric element 10 may be formed by metal, and/or ceramics, or the like.

Figure 2:
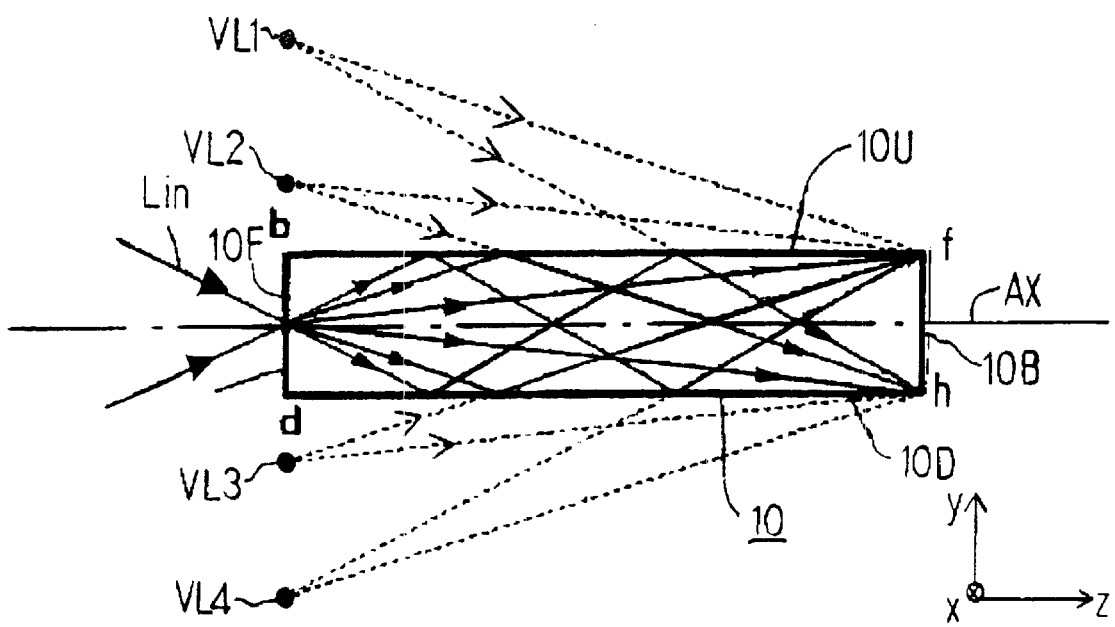
FIG. 2 is a diagram explaining an effect of the catoptric element.

An effect of the catoptric element 10 is explained with reference to FIG. 2. In FIG. 2, in order to simplify the explanation, light flux is shown only in the y-z sectional plane, which is a sectional plane parallel to a central axis AX of the catoptric element 10. Incident light Lin is reflected on multi-layer surfaces ML (not shown) formed on the upper inner surface 10U and on the lower inner surface 10D in a way shown by solid lines, or it reaches the exit surface 10B without reflecting on the inner surface W (for example, if the light is incident parallel to or close to parallel to the axis AX). The reflected light rays from the inner surface W are like light rays produced from virtual light sources VL1, VL2, VL3, and VL4 formed on a plane including the incident surface 10F. By combining the light rays reflected on different positions of the inner surface W, the exit surface 10B is illuminated with these various light rays being superimposed on each other. Accordingly, the exit surface 10B is superimposedly illuminated from a large number of virtual light sources, so that the exit surface 10B is illuminated with good uniformity.

In addition, in the catoptric element 10 according to this embodiment, the shapes of the incident surface 10F and the exit surface 10B are both rectangular; however, the shape may be, for example, circular as shown in FIG. 3(a), square as shown in FIG. 3(b), or shapes shown in FIGS. 3(c), (d), or (e), as long as the shape corresponds to a shape of the area to be illuminated. It is preferable that the shape of the area to be illuminated and the shape of the exit surface 10B are similar.

Further, in the catoptric element 10 according to the first embodiment, the area of light flux to the exit surface side can be varied by arranging a shielding member S in the central portion of the hollow catoptric element as shown in FIGS. 9(a), (b), and (c). For example, FIG. 9(a) shows a case where a central portion of a circular aperture is shielded by a circular shield. FIG. 9(b) shows a case where a central portion of a rectangular aperture is shielded by a rectangular shield. FIG. 9(c) shows a case where a central portion of a square aperture is shielded by a square shield.

It also is possible to have variations in which a circular aperture is shielded to be square (FIG. 9(d)), a circular aperture is shielded to be rectangular (FIG. 9(e)), a rectangular aperture is shielded to be circular (FIG. 9(f)), and a square aperture is shielded to be circular (FIG. 9(g)).

The thickness of the multi-layer film coated on the inner surface W for enhancing reflectance of light need not be constant. For example, it is preferable that the thickness d of the multi-layer film satisfies a Bragg reflection equation shown below in response to an incident angle of the incident light Lin varying in accordance with each position of the inner surface W:

$$2d \times \sin\theta = n\lambda$$

where d is a thickness of one layer of the multi-layer film, $\theta$ is an incident angle, and $\lambda$ is a wavelength of an incident light Lin.

Figure 4A:
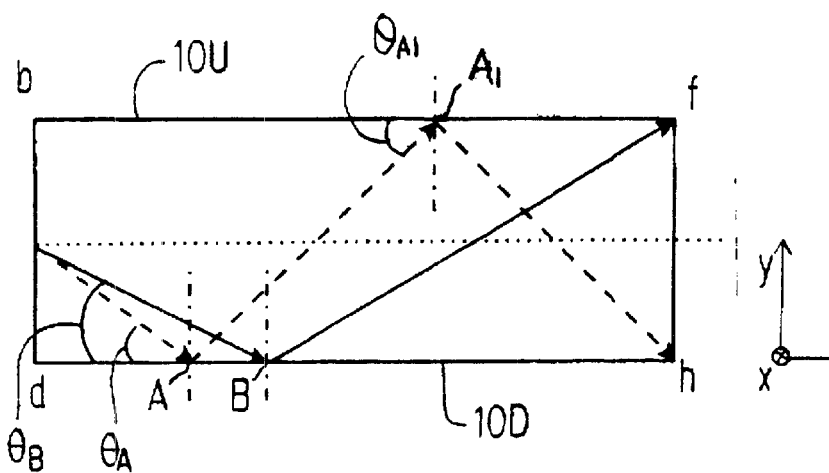
FIGS. 4(a) and (b) are diagrams explaining a relation between an incident angle and a film thickness.
Figure 4B:
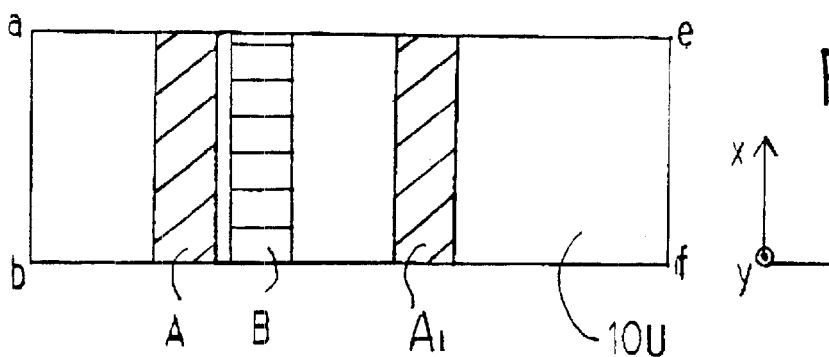

FIGS. 4(a) and 4(b) are diagrams graphically explaining a relation between an incident angle and a thickness of a multi-layer film. Among the incident light Lin, a light incident to the position A of the lower inner surface 10D at an incident angle $\theta_A$ shown by the dotted line is reflected at an angle $\theta_A$, and then is incident to the position $A_1$ of the upper inner surface 10U at an incident angle $\theta_{A1}$ and reflected at an angle $\theta_{A1}$. Among the incident light Lin, a light incident to the position B of the lower inner surface 10D at an incident angle $\theta_B$ is reflected at an angle $\theta_B$ shown by the solid line, and reaches the position f. Here, because the incident angles $\theta_A$ and $\theta_{A1}$ in FIG. 4(a) are the same, the areas including A or $A_1$ in FIG. 4(b) indicated by diagonal lines are coated with a multi-layer film having the same thickness in accordance with the Bragg reflection equation. However, the incident angle $\theta_A$ at the position A is different from the incident angle $\theta_B$ at the position B, so that the thickness of the multi-layer film coated on the area A in FIG. 4(b) is different from the thickness of the multi-layer film coated on the area B. Furthermore, when a large number of reflections are made on the inner surface W, it is preferable to provide a structure in which the thickness of the multi-layer film varies position-by-position periodically. The same kind of materials can be used for the multi-layer film ML in all surfaces of the inner surface W. However, it is more preferable that different kinds of materials are used at the positions A and B in order to satisfy the aforementioned Bragg reflection equation.

CVD (chemical vapor deposition) preferably is used in the manufacture of the catoptric element in order to control the thickness of the multi-layer film coated on the inner surface W. Various CVD steps are applied to the manufacture of the catoptric element. For example, optical CVD, plasma CVD, or thermal CVD can be applied.

Second Embodiment

The second embodiment relates to an illumination optical system equipped with the aforementioned catoptric element.

Figure 5A:
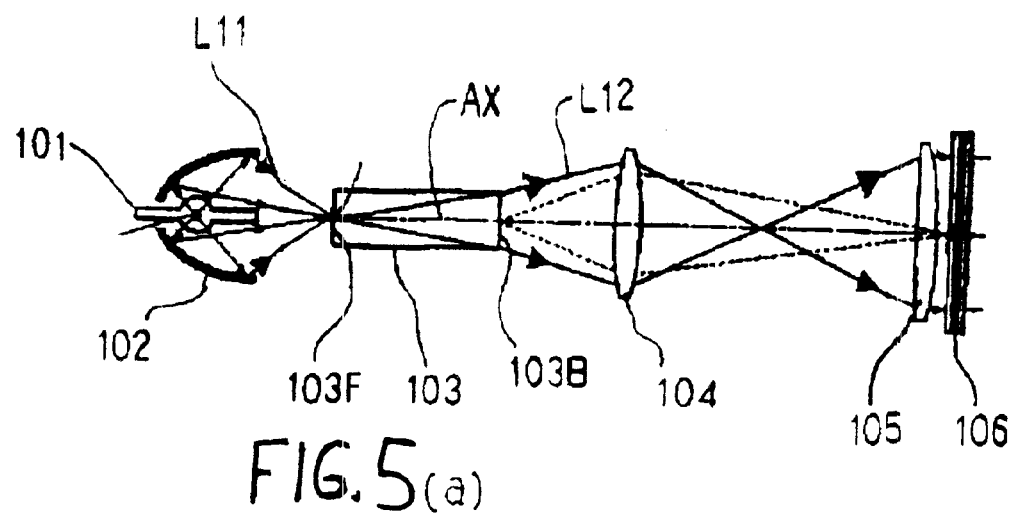
FIGS. 5(a) and (b) are diagrams showing a construction of a conventional illumination optical system.
Figure 5B:
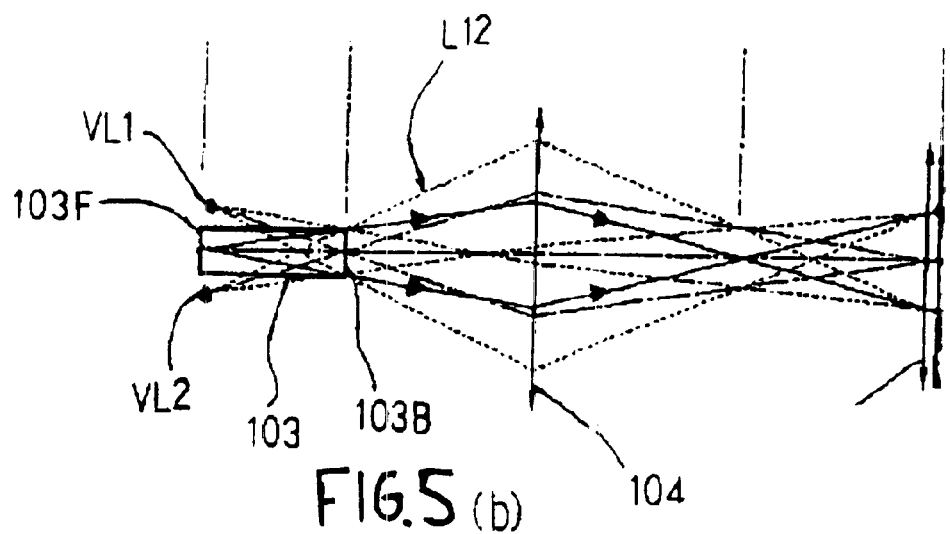

FIGS. 5(a) and (b) are diagrams showing a construction of a conventional illumination optical system equipped with a rod-type optical integrator 103 suitable for a projection type display. In FIG. 5(a), a light flux L11 emitted from a lamp 101 is reflected by an ellipsoidal mirror 102 having a rotationally symmetrical ellipsoidal reflection surface with respect to the optical axis AX, and is incident to an incident surface 103F of the rod-type conventional optical integrator 103. A light flux L12 leaving from an exit surface 103B illuminates a liquid crystal panel 106 via a relay lens 104 and a field lens 105. FIG. 5(b) is a diagram showing an effect of the aforementioned rod-type conventional optical integrator 103. It shows a state in which the exit surface 103B of the optical integrator 103 is superimposedly illuminated by a plurality of virtual light sources VL1, VL2, and the like having optical paths shown by dotted lines.

However, there is no glass material that is transparent for light having a wavelength shorter than 157 nm as described above, so that the rod-type optical integrator 103 cannot pass the EUV light. Accordingly, the illumination optical system shown in FIG. 5(a) cannot be used for the EUV light.

Figure 6:
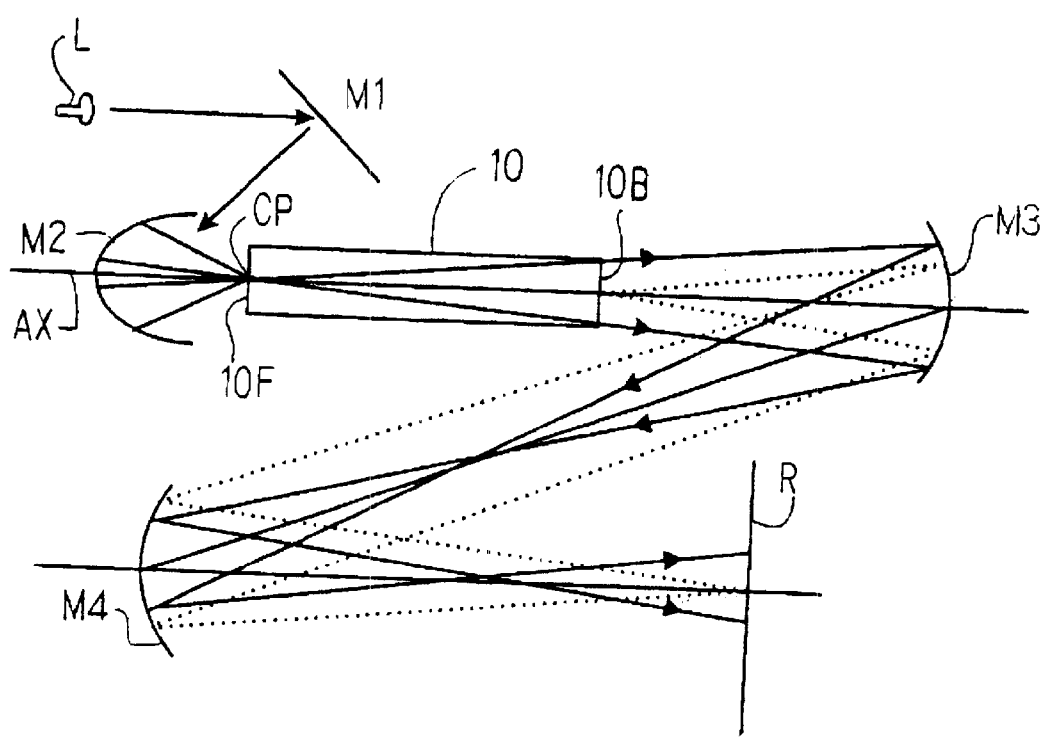
FIG. 6 is a diagram-showing an illumination optical system according to a second embodiment of the invention.

FIG. 6 is a diagram showing a construction of an illumination optical system according to a second embodiment of the invention. When a light source (such as a synchrotron) L is too large to install in the ellipsoidal mirror, light provided from the light source is reflected by a mirror M1 and is incident to the ellipsoidal mirror M2 having a rotationally symmetrical ellipsoidal reflection surface relative to the optical axis AX. The light incident to the ellipsoidal mirror M2 passes through a first focal point, so that the light reflected by the ellipsoidal mirror converges to a converging point CP near a second focal point of the ellipsoidal mirror M2.

A catoptric element 10 according to the invention is arranged such that its incident surface 10F is located in the vicinity of the converging point CP. Reflected light from the inner surface of the catoptric element 10 exits from the exit surface 10B. A concave mirror M3 is arranged to form an image of the exit surface 10B of the catoptric element 10 onto a reflective reticle R, which is located at the illumination plane. Light reflected from the concave mirror M3 illuminates the reflective reticle R via a concave mirror M4. In FIG. 6, a principal ray from a virtual light source is expressed by broken lines and marginal rays are expressed by solid lines. The concave mirror M3 corresponds to the relay lens 104 in FIG. 5(a), and the concave mirror M4 corresponds to the field lens 105, respectively. By using this construction, the reflective reticle R can be illuminated uniformly.

Moreover, it is preferable that the sectional shape of the exit surface 10B of the catoptric element 10 is geometrically congruent or similar to the shape of the area to be illuminated on the reflective reticle R. Whenever the congruent or similar relation is maintained, a sectional shape of the light flux illuminating the area to be illuminated becomes a conjugate image congruent or similar to the exit surface 10B via the concave mirror M3, so that enhancement of the illumination efficiency can be obtained.

Figure 7:
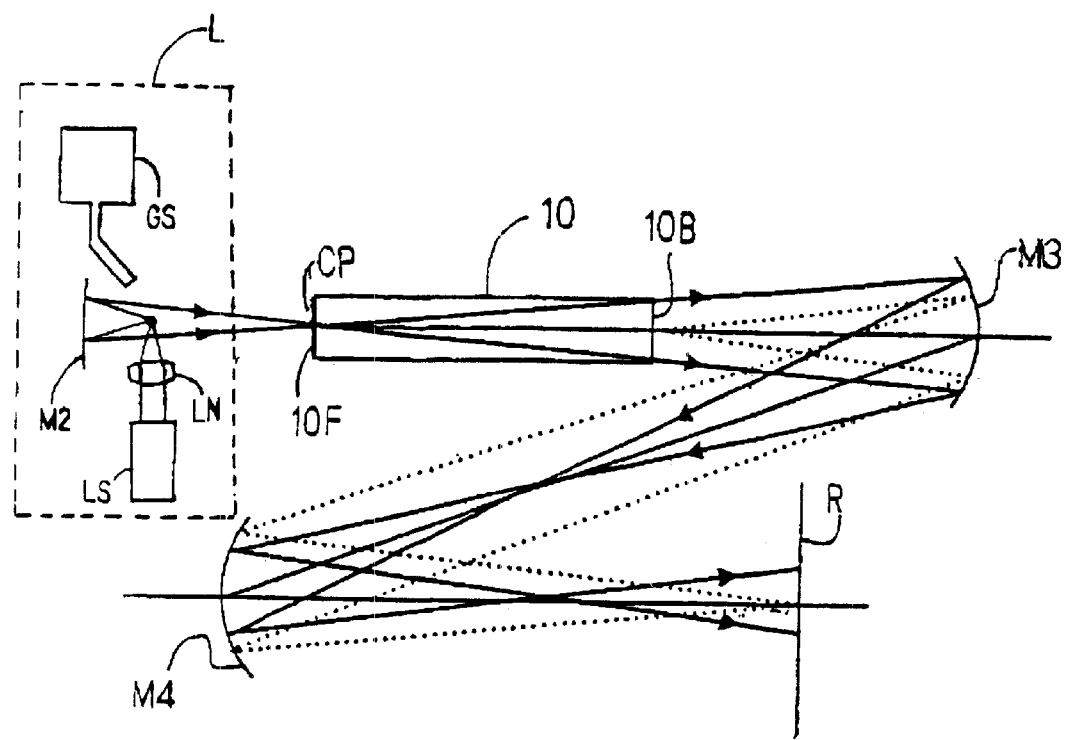
FIG. 7 is a diagram showing an illumination optical system according to another embodiment of the invention.

Referring to FIG. 7, when a laser plasma x-ray source L having a small dimension is employed, an origin of the light source L can be arranged in the vicinity of a first focal point of the concave mirror M2 in order to converge light from the light source L to a converging point CP in the vicinity of a second focal point of the concave mirror M2. The laser plasma x-ray source converges laser light to a converging point in the vicinity of the first focal point by using a laser source LS and a lens LN, and supplies Xe or Kr gas aimed at the converging point. The Xe or Kr gas is supplied by a gas-discharging device GS. Accordingly, a plasma x-ray is emitted from the converging point.

Furthermore, it is preferable that the catoptric element 10 is coated with a multi-layer film to enhance reflectance as with the first embodiment. It is preferable that the materials of the multi-layer film are the aforementioned Mo/Si, W/Si, Cr/C, Ni/C, NiCr/C, and the like. Moreover, it is preferable that the catoptric element 10 is evacuated at least inside of the hollow part or filled with gas that is transparent to the light that is used.

Third Embodiment

Figure 8:
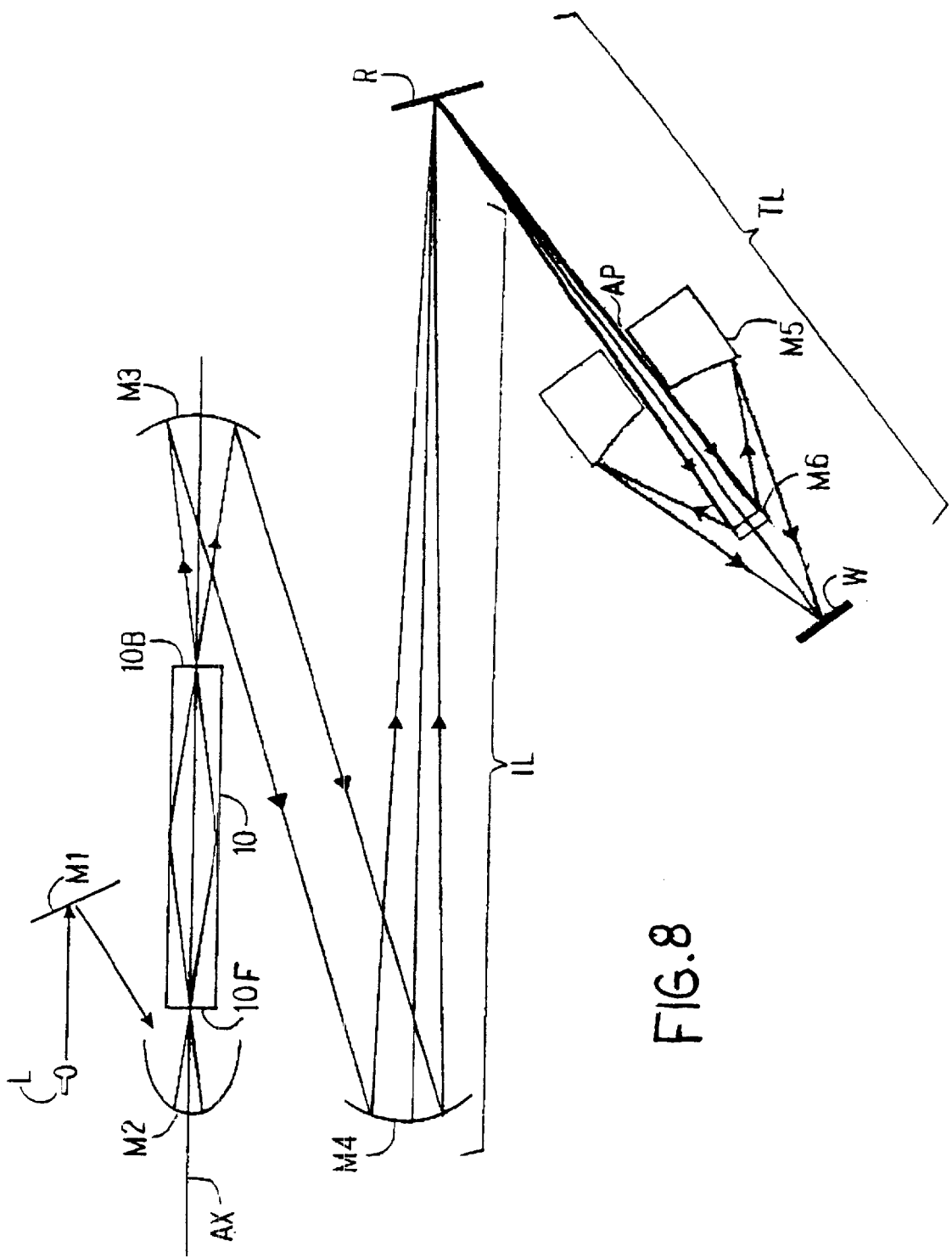
FIG. 8 is a diagram showing a projection exposure apparatus according to a third embodiment of the invention.

FIG. 8 is a schematic diagram showing a construction of a projection exposure apparatus according to a third embodiment of the invention. The same portion as the second embodiment described above (i.e., the illumination optical system) is denoted with the same symbols used in the second embodiment, and therefore duplicate explanation will be abbreviated. The projection exposure apparatus according to the third embodiment is constructed with the illumination optical system IL according to the second embodiment and with a projection optical system TL. Light reflected from the reflective reticle R, which is illuminated by the illumination optical system IL, passes through a central aperture portion AP of a concave mirror M5, and is reflected by a convex mirror M6. The light reflected by the convex mirror M6 is reflected by the concave mirror M5, and an image of the pattern formed on the reflective reticle R is projected onto a wafer W. By using this construction, the image of the reticle pattern can be projected with uniform illumination light, so that the pattern can be transferred precisely.

The invention can be applied not only to the projection exposure apparatus for manufacturing semiconductor devices, but also to exposure apparatus for transferring a device pattern onto a glass plate used for manufacturing a display including a liquid crystal device, exposure apparatus for transferring a device pattern onto a ceramic wafer used for manufacturing a thin film magnetic head, and to exposure apparatus for manufacturing imaging devices (such as a CCD). Furthermore, the invention can be applied to an exposure apparatus for transferring a circuit pattern onto a glass substrate or a silicon wafer for manufacturing a reticle or a mask. An ordinary metallic reflection film such as aluminum can be used when the wavelength to be used is longer than 100 nm.

Thus, the catoptric element according to the invention makes it possible to effectively obtain a light having a uniform intensity distribution by using a light having a wavelength shorter than 157 nm with a simple construction. In addition, since the illumination optical system according to the invention uses the aforementioned catoptric element, the area to be illuminated can be effectively illuminated with light having a uniform intensity distribution and having a wavelength shorter than 157 nm. Furthermore, the projection exposure apparatus according to the invention makes it possible to project a fine pattern formed on a reticle onto a wafer by using light having a wavelength shorter than 157 nm. In addition, a method for manufacturing devices according to the invention makes it possible to easily manufacture devices having a fine pattern.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A catoptric element having a hollow member comprising:

an inner reflective surface of the hollow member that reflects a plurality of times light having a wavelength shorter than about 157 nm; and a first surface that includes an incident plane to allow the light to enter into the hollow member, and a second surface that includes an exit plane to allow the reflected light to exit from the hollow member;

wherein light-source images from a plurality of virtual light sources are superimposed in a vicinity of the exit plane by the inner reflective surface so that the exit plane is illuminated with an approximately uniform light intensity.

2. The catoptric element according to claim 1, wherein the inner reflective surface is a multi-layer film having a thickness satisfying a Bragg reflection.

3. The catoptric element according to claim 2, wherein the thickness of the multi-layer film varies in accordance with an incident angle of light incident to an incident surface of the catoptric element.

4. The catoptric element according to claim 1, wherein the hollow member is made at least partly from metal.

5. The catoptric element according to claim 1, wherein the hollow member is made at least partly from ceramic.

6. The catoptric element according to claim 1, wherein the inner reflective surface is coated with a single-layer film of coating material.

7. The catoptric element according to claim 6, wherein the coating material includes one or more of: Mo (molybdenum)/Si (silicon), W (tungsten)/Si, Cr (chromium)/C (carbon), Ni (nickel)/C, and NiCr (nickel.chromium)/C.

8. The catoptric element according to claim 1, wherein the inner reflective surface is coated with a multiple-layer film of coating material.

9. The catoptric element according to claim 8, wherein the coating material includes one or more of: Mo (molybdenum)/Si (silicon), W (tungsten)/Si, Cr (chromium)/C (carbon), Ni (nickel)/C, and NiCr (nickel.chromium)/C.

10. The catoptric element according to claim 1, wherein the second surface of the catoptric element is rectangular.

11. The catoptric element according to claim 1, wherein the second surface of the catoptric element is circular.

12. An illumination optical system for illuminating an illumination plane, the illumination optical system comprising:

a light source that provides a light flux;

a catoptric element including a hollow member having an inner reflective surface that reflects light having a wavelength shorter than about 157 nm, which generates a plurality of images of the light source by internally reflecting the light flux supplied from the light source; and a relay optical system that leads the light from the catoptric element to the illumination plane.

13. The illumination optical system according to claim 12, wherein an inside space of the hollow member of the catoptric element is filled with gas having a low absorption to the light flux.

14. The illumination optical system according to claim 12, wherein an inside space of the hollow member of the catoptric element is filled with gas that is transparent to the light flux.

15. The illumination optical system according to claim 12, wherein an inside space of the hollow member of the catoptric element is evacuated.

16. The illumination optical system according to claim 12, wherein the light source is a laser plasma x-ray source.

17. A projection exposure apparatus for projecting and transferring a pattern formed on a projection original onto a substrate, the projection exposure apparatus comprising:

the illumination optical system according to claim 12; and a projection optical system;

wherein the illumination plane is formed on the projection original, and the projection optical system is located between the projection original and the substrate.

18. A method for manufacturing a device utilizing the projection exposure apparatus according to claim 17, the method comprising the steps of:

applying a photosensitive material onto the substrate to be exposed;

projecting the pattern formed on the projection original onto the substrate via the projection optical system;

developing the photosensitive material on the substrate; and forming a circuit pattern on the substrate by using the photosensitive material after being developed as a mask.

19. A catoptric element comprising a member having:

an input surface that receives incident light;

an exit surface through which light that has entered the member through the input surface exits the member; and the member being hollow between the input surface and the exit surface to define an inner reflective surface, extending between the input surface and the exit surface, the inner reflective surface reflects light having a wavelength shorter than about 157 nm.

20. The catoptric element according to claim 19, wherein the inner reflective surface is a multi-layer film having a thickness satisfying a Bragg reflection.

21. The catoptric element according to claim 20, wherein the thickness of the multi-layer film varies in accordance with an incident angle of light incident to the input surface of the catoptric element.

22. The catoptric element according to claim 19, wherein the inner reflective surface is coated with a single-layer film of coating material, but the input surface and the exit surface are not coated with the single-layer film.

23. The catoptric element according to claim 19, wherein the inner reflective surface is coated with a multiple-layer film of coating material, but the input surface and the exit surface are not coated with the multiple-layer film.

24. The catoptric element according to claim 19, wherein the input surface and the exit surface of the catoptric element are rectangular.

25. The catoptric element according to claim 19, wherein the input surface and the exit surface of the catoptric element are circular.

* * * * *